United States Patent
Daniel et al.

(10) Patent No.: US 6,285,619 B1
(45) Date of Patent: *Sep. 4, 2001

(54) MEMORY CELL

(75) Inventors: Gabriel Daniel, Jamaica Esrates; Oliver Weinfurtner, Wappingers Falls, both of NY (US)

(73) Assignee: Infineon Technologies North America Corp., San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 16 days.

(21) Appl. No.: 09/442,982

(22) Filed: Nov. 18, 1999

(51) Int. Cl.[7] .................................................. G11C 7/00
(52) U.S. Cl. ......................................................... 365/225.7
(58) Field of Search ................................. 365/225.7, 200

(56) References Cited

U.S. PATENT DOCUMENTS

| | | | |
|---|---|---|---|
| 5,208,775 | * 5/1993 | Lee ..................................... | 365/225.7 |
| 5,579,266 | * 11/1996 | Tahara ................................ | 365/225.7 |
| 5,689,465 | * 11/1997 | Sukegawa et al. ................ | 365/225.7 |
| 5,696,723 | * 12/1997 | Tukahara ........................... | 365/225.7 |
| 5,898,626 | * 4/1999 | Chiang et al. .................... | 365/225.7 |
| 5,910,921 | * 6/1999 | Beffa et al. ....................... | 365/200 |
| 5,933,382 | * 8/1999 | Yi et al. ............................. | 365/225.7 |

* cited by examiner

*Primary Examiner*—Trong Phan
(74) *Attorney, Agent, or Firm*—Stanton Braden

(57) ABSTRACT

A circuit for storing a bit of data is provided, where the circuit includes a first fuse having a first end and a second end and a second fuse having a third end and a fourth end. The first end of the first fuse is connected to a logic 0 input and its second end is connected to a common output. The third end of the second fuse is connected to a logic 1 input and the fourth end is connected to the common output. To store the bit of data, one of the first and second fuses is selectively blown. Hence, two fuses can be used to store a bit of information.

5 Claims, 5 Drawing Sheets

| FIRST FUSE 22 | BLOWN | INTACT |
|---|---|---|
| SECOND FUSE 24 | INTACT | BLOWN |
| BIT | 1 | 0 |

MEMORY CELL

BACKGROUND OF THE INVENTION

This invention relates to memory cells which use fuses to permanently store data in integrated circuits.

FIG. 1 shows an exemplary memory cell 10 for storing one bit of data in an integrated circuit. The stored bit may be part of a chip identification number, may indicate to a decoder whether a redundant circuit should be used in place of a main circuit, may store a default value to be used by control circuitry of the integrated circuit, or may be used for a variety of other purposes.

Memory cell 10 includes a fuse 12 and a latch 14. Fuse 12 stores the bit of data. During power-up of the integrated circuit, the information stored by fuse 12 is read by the circuitry to which the information applies. To read the information during power-up, a recharging signal (bFPUP) first recharges latch 12. Next, a read signal (FPUN) cause the information stored in fuse 12 to be output as the BIT signal. If fuse 12 is not blown, the FPUN signal causes node N to be grounded and, hence, causes the BIT signal to be high. If fuse 12 is blown, node N remains high which causes the BIT signal to be low.

FIG. 2 shows an exemplary integrated circuit lay out for two adjacent memory cells of the type shown in FIG. 1. Each one of these memory cells can use, for example, a six transistor latch 14 to store and allow reading a single bit of data. In some implementations, each one of the latches 14 occupies close to 1.5 times the layout area required by a single fuse 12. In addition, each one of latches 14 can increase the pitch of memory cell 10 (that is, the minimum required space between adjacent memory cells) to be more than that required by fuse 12.

Referring to FIG. 3, in a highly integrated circuit, thousands of fuse and latch memory cells may be used. To read them during power-up, significant current is required. Such a high current can damage the integrated circuit. Hence, instead of reading all of the memory cells at the same time, the memory cells in the integrated circuit are organized into memory cell banks which are then read sequentially according to a predetermined sequence. In FIG. 3, for example, line 14 shows the sequence by which memory cell banks BK are read. To implement the sequence, buffers are used to delay the bFpup and FPUN signals from one memory cell bank to the next. These buffers require additional space on the integrated circuit chip.

SUMMARY OF THE INVENTION

In one general aspect, the invention features a circuit for storing a bit of data, where the circuit includes a first fuse having a first end and a second end and a second fuse having a third end and a fourth end. The first end of the first fuse is connected to a logic 0 input and its second end is connected to a common output. The third end of the second fuse is connected to a logic 1 input and the fourth end is connected to the common output. To store the bit of data, one of the first and second fuses is selectively blown.

Hence, according to the invention, two fuses can be used to store a bit of information.

In another aspect the invention features an integrated circuit which includes a first circuit and a second circuit. The first circuit stores a bit of data and includes a first fuse having a first end and a second end and a second fuse having a third end and a fourth end. The first end of the first fuse is connected to a logic 0 input and its second end is connected to a common output. The third end of the second fuse is connected to a logic 1 input and the fourth end is connected to the common output. To store the bit of data, one of the first and second fuses is selectively blown. The second circuit has an input connected said common input to read said stored bit of information.

In yet another aspect, the invention features an array for storing bits of data. The array includes a plurality of circuits for storing the bits of data, including a circuit which includes a first fuse having a first end and a second end and a second fuse having a third end and a fourth end. The first end of the first fuse is connected to a logic 0 input and its second end is connected to a common output. The third end of the second fuse is connected to a logic 1 input and the fourth end is connected to the common output. To store a bit of data, one of the first and second fuses is selectively blown.

Preferred embodiments of the invention may include one or more of the following features.

A long-channel MOS transistor is provided where one of the source and drain is connected to the first end of the first fuse and the other one of the source and drain is connected to a power supply for providing a voltage corresponding to either logic 1 or logic 0. The first and third ends can be connected to the common output through an inverter. The fuses may be laser or electrical fuses.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will become apparent from the following description of preferred embodiments, including the drawings, and from the claims.

DESCRIPTION OF THE PREFERRED EMBODIMENTS

Figures 4, 4A:
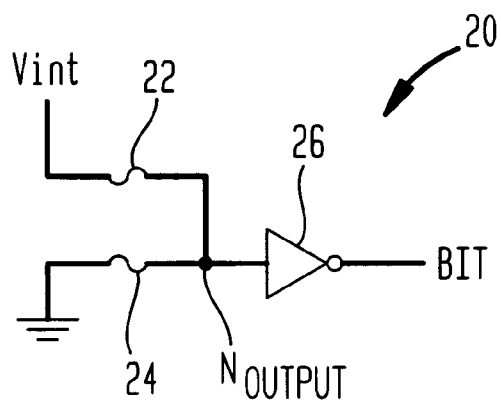
FIG. 4 is a schematic diagram of a memory cell circuit according to the present invention.
FIG. 4A is a diagram useful in understanding the operation of the circuit of FIG. 4.

Referring to FIG. 4, a memory cell 20 includes a first fuse 22 and a second fuse 24. First fuse 22 is connected at one end to the Vint signal representing, here, logic 1. First fuse 22 is connected at the other end to an output node (Noutput). Second fuse 24 is also connected at one end to Noutput. However, unlike fuse 22, fuse 24 is connected at its other end to ground, here, representing logic 0.

To store a bit of data in memory cell 20, one of the first fuse 22 and second fuse 24 is selectively blown. Referring to FIG. 4A, if first fuse 22 is blown and second fuse 24 remains intact, Noutput will be shorted to ground causing output of inverter 26 to be high. Hence, the BIT signal will represent logic 1. In other words, if first fuse 22 is blown, memory cell 20 stores a A1". However, if first fuse 22 remains intact and second fuse 24 is blown, the voltage at Noutput will be at Vint and, hence, output of inverter 26 will be low. Hence, the BIT signal will represent logic 0 and memory cell 20 stores a A0".

Fuses 22 and 24 may be any type of conventional fuses used in integrated circuits, including electrical and laser fuses. Electrical fuses are those fuses which are blown by a voltage or current surge. Laser fuses are those fuses which are blown by a laser beam.

Figure 1:
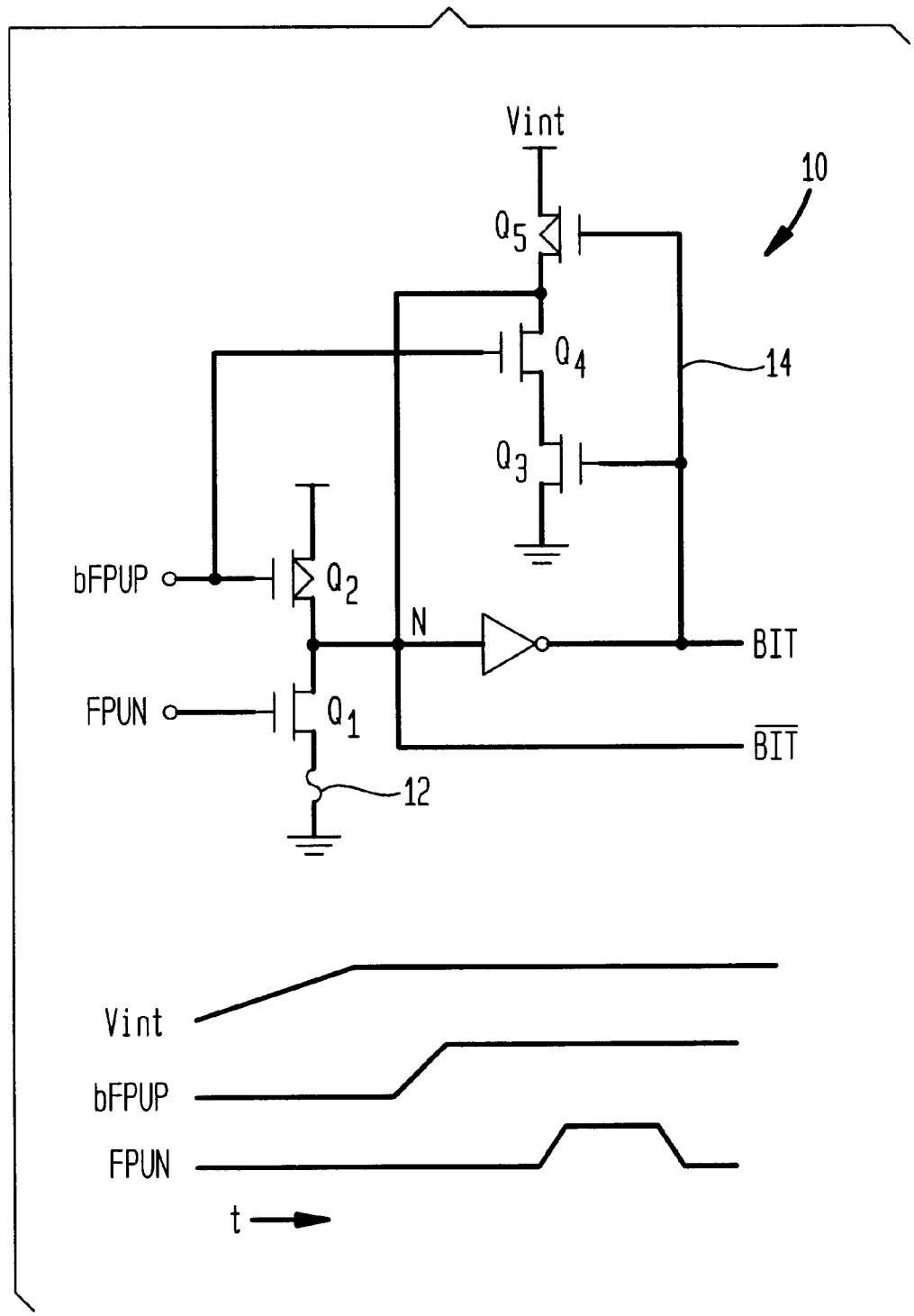
FIG. 1 shows a schematic diagram of the circuitry of a prior art fuse and latch memory cell.
Figure 2:
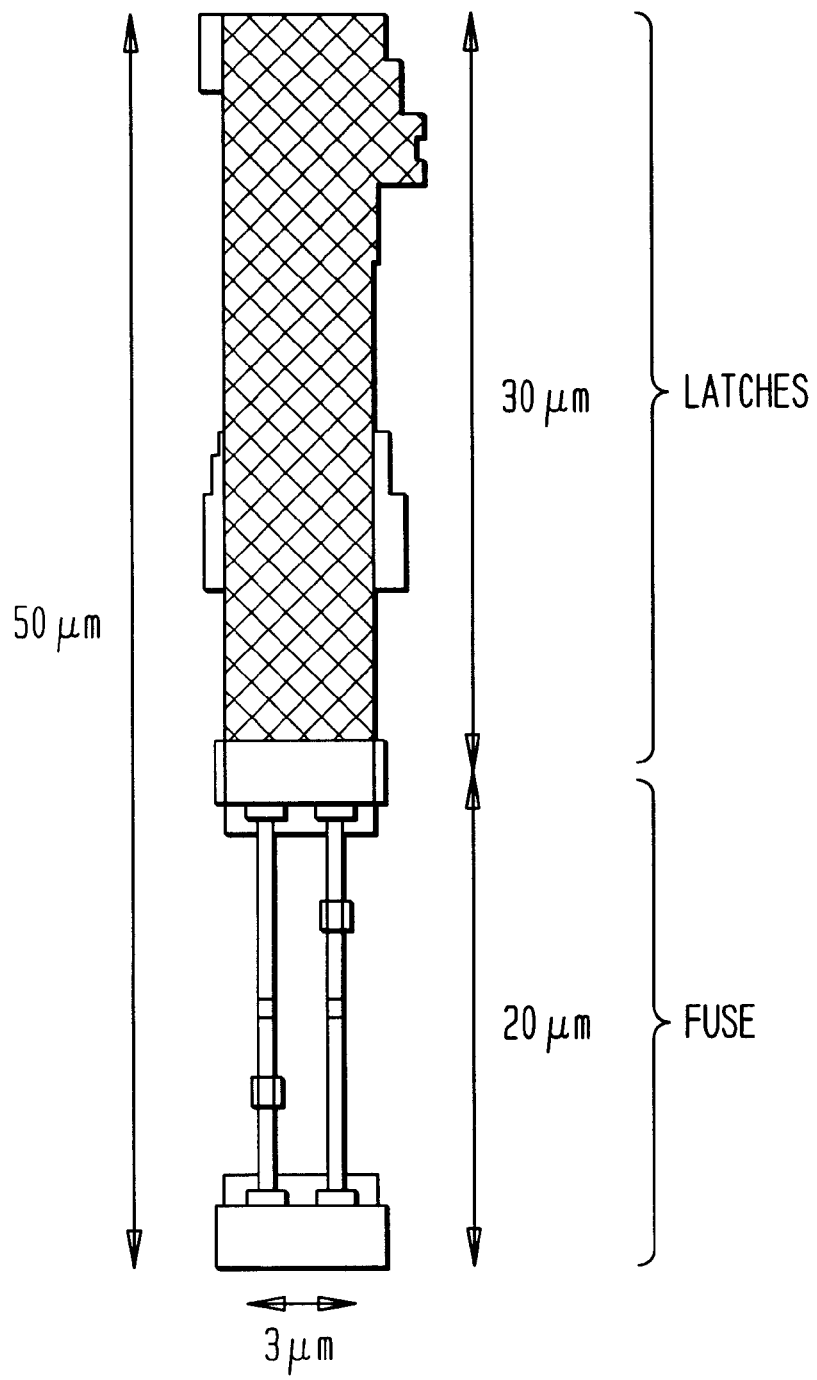
FIG. 2 shows an exemplary layout of the prior art fuse and latch memory cell of FIG. 1.
Figure 3:
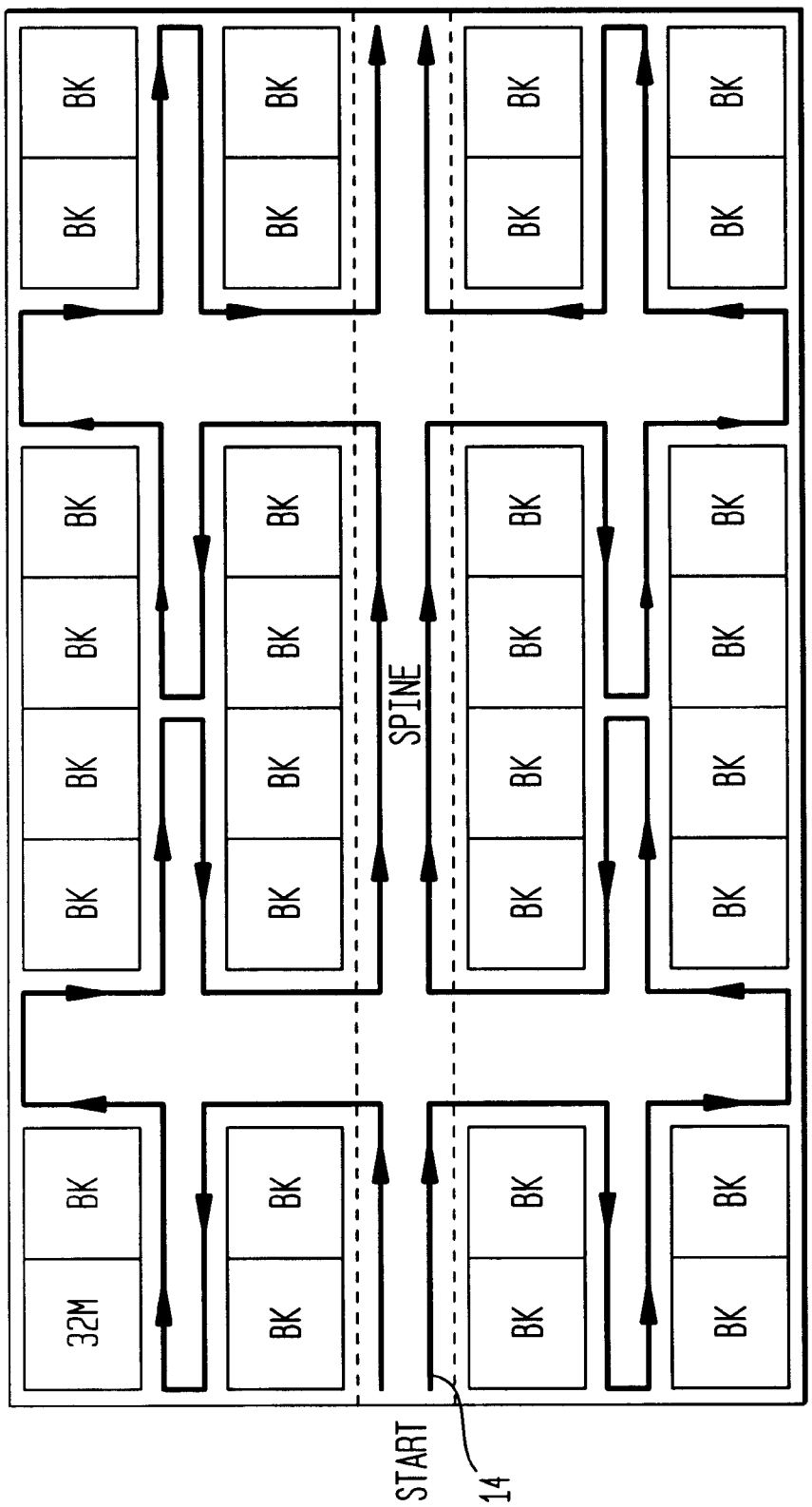
FIG. 3 is a diagrammatical illustration of a prior art sequential reading of fuse banks of an integrated circuit during power-up.

Because memory cell 20 does not use a latch circuit (such as latch 14 of memory cell 10 shown in FIG. 1), it requires relatively less layout area. For example, consider a latch circuit of a latch and fuse memory cell (such as memory cell 10 in FIGS. 1–2) which requires 1.5 times layout area as the fuse in the memory cell. If that memory cell is implemented as memory cell 20 by using two fuses, there may be up to 20% or more saving in layout area required by the memory cell.

Figure 5:
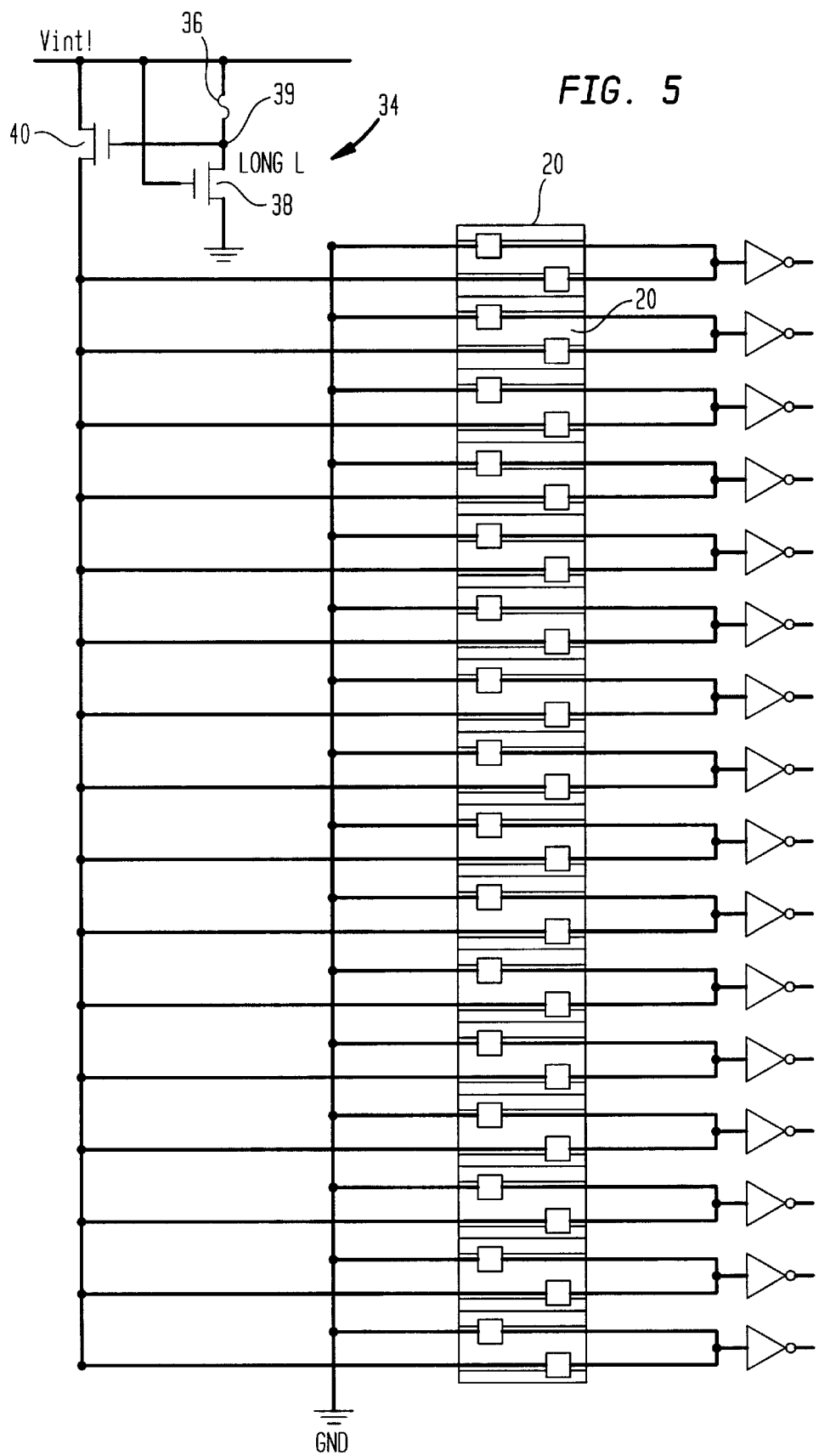
FIG. 5 shows an arrangement of an array of memory cells according to the invention.

Referring to FIG. 5, a number of memory cells 20 can be arranged into a memory cell array 30. Memory cell array 30 includes a power safety circuit 34. Prior to determining which fuse in each one of memory cells 20 should be blown, each memory cell 20 in array 30 is essentially a direct connection between Vint and ground. To avoid damaging the integrated circuit, power safety circuit 34 insures that the connection Vint and each memory cell 20 is open circuited.

Power safety circuit 34 includes a fuse 36, a long channel n-MOS transistor 38, and a p-MOS transistor 40. The long channel n-MOS transistor 38 is implemented such that little if any current flows from its source to its drain even when the gate voltage is high. Hence, even when the gate is high, the node 39 remains at Vint. Hence, when the Vint signal is high, the gate of p-FET transistor 40 will be at Vint and hence preventing a channel from forming between source and drain of the transistor. Hence, the connection between Vint and memory cells 20 are open circuited. After blowing the appropriate fuses in memory cells 20 of array 30, fuse 36 is also blown. This results in the voltage at node 39 to be at ground, resulting in a channel being formed between source and drain of p-MOS transistor 40.

An integrated circuit which implements its memory cell banks by using array 30 would not necessarily require sequential reading of the fuse banks during power-up, further reducing the lay out area required for implementing the memory cell banks.

It is to be understood that while the invention has been described in conjunction with the detailed description thereof, the foregoing description is intended to illustrate and not limit the scope of the invention, which is defined by the scope of the appended claims. Other aspects, advantages, and embodiments are within the scope of the following claims.

What is claimed is:

1. An array for storing bits of data, the array comprising:
   (A) a plurality of circuits each one thereof for storing a corresponding one of the bits of data, each one of the circuits comprising:
      (i) a first fuse having a first end and a second end, said first end being connected to a first logic state input and said second end being connected to a common output, and
      (ii) a second fuse having a third end and a fourth end, said third end being connected to a second, opposite logic state input and said fourth end being connected to said common output, wherein one of the bits of data is stored by selectively blowing one of the first and second fuses;
      (iii) wherein such stored corresponding one of the bits of data is produced at the common output of such one of the circuits;
   (B) a first connector connecting the first end of the first fuse of each one of the plurality of circuits together;
   (C) a second connector connecting the third end of the second fuse of each one of the plurality of circuits together and to the second logic state input; and
   (D) a switch, such switch comprising:
      (i) a third fuse; and
      (ii) a pair of transistors, a first one of the pair of transistors having source and drains thereof connected between the first logic state input and the first connector, a second one of the pair of transistors having a gate connected to first logic state input, one of the source and drains of the second transistor being coupled to: the first logic state input through the third fuse; a gate of the first transistor and the other one of the source and drains of the second transistor being connected to the second logic state input.

2. The array of claim 1 wherein said second transistor comprises a long-channel MOS transistor.

3. The array of claim 1 wherein the first and second fuses are laser fuses.

4. The array of claim 1 wherein the first and second fuses are electrical fuses.

5. The array of claim 1 further comprising an inverter wherein the second end of the first fuse and the fourth end of the second fuse are connected to the common output through an inverter.

* * * * *